US008580477B2

(12) United States Patent
Knapp et al.

(10) Patent No.: US 8,580,477 B2
(45) Date of Patent: Nov. 12, 2013

(54) AQUEOUS BASE-DEVELOPABLE NEGATIVE-TONE FILMS BASED ON FUNCTIONALIZED NORBORNENE POLYMERS

(75) Inventors: Brian Knapp, Medina, OH (US);
Edmund Elce, Lakewood, OH (US);
Andrew Bell, Lakewood, OH (US);
Cheryl Burns, Bristolville, OH (US);
Sridevi Kaiti, North Royalton, OH (US);
Brian Kocher, North Canton, OH (US);
Hendra Ng, Highland Heights, OH (US); Yogesh Patel, Mansfield, OH (US); Masanobu Sakamoto, Medina, OH (US); Xiaoming Wu, Lexington, KY (US); Linda Zhang, Brecksville, OH (US)

(73) Assignee: Promerus LLC, Brecksville, OH (US)

( * ) Notice: Subject to any disclaimer, the term of this patent is extended or adjusted under 35 U.S.C. 154(b) by 779 days.

(21) Appl. No.: 12/563,627

(22) Filed: Sep. 21, 2009

(65) Prior Publication Data
US 2011/0070543 A1 Mar. 24, 2011

(51) Int. Cl.
*G03F 7/038* (2006.01)
*C08L 45/00* (2006.01)

(52) U.S. Cl.
CPC ............... *G03F 7/0382* (2013.01); *C08L 45/00* (2013.01); *Y10S 430/106* (2013.01)
USPC .......................... 430/270.1; 430/905; 526/281

(58) Field of Classification Search
CPC ... G03F 7/0397; G03F 7/0382; C08F 232/08; C08L 45/00
USPC ................................. 430/270.1, 905; 526/281
See application file for complete search history.

(56) References Cited

U.S. PATENT DOCUMENTS

| | | | |
|---|---|---|---|
| 6,420,503 B1 | 7/2002 | Jayaraman et al. | |
| 6,509,134 B2 * | 1/2003 | Ito et al. | 430/270.1 |
| 6,548,219 B2 * | 4/2003 | Ito et al. | 430/270.1 |
| 6,579,658 B2 * | 6/2003 | Hatakeyama et al. | 430/270.1 |
| 7,022,790 B2 | 4/2006 | Elce et al. | |
| 7,524,594 B2 | 4/2009 | Amoroso et al. | |
| 2004/0229157 A1 | 11/2004 | Rhodes et al. | |
| 2007/0066775 A1 | 3/2007 | Rhodes et al. | |
| 2008/0242810 A1 | 10/2008 | Rhodes et al. | |

FOREIGN PATENT DOCUMENTS

| | | |
|---|---|---|
| JP | 05 165214 A | 7/1993 |
| JP | 2000199958 A | 7/2000 |
| JP | 2003162054 A | 6/2003 |

\* cited by examiner

*Primary Examiner* — John Chu
(74) *Attorney, Agent, or Firm* — The Webb Law Firm

(57) ABSTRACT

Embodiments in accordance with the present invention encompass negative-tone, aqueous base developable, self-imageable polymer compositions useful for forming films that can be patterned to create structures for microelectronic devices, microelectronic packaging, microelectromechanical systems, optoelectronic devices and displays.

11 Claims, 5 Drawing Sheets

AQUEOUS BASE-DEVELOPABLE NEGATIVE-TONE FILMS BASED ON FUNCTIONALIZED NORBORNENE POLYMERS

TECHNICAL FIELD

The present invention relates generally to norbornene-type polymer compositions and more specifically to negative-tone, self-imageable films formed of such compositions, and the methods of forming structures of such films that are useful in microelectronic, optoelectronic and micromechanical devices.

BACKGROUND

Polymers are widely used as protective, dielectric, passivation and redistribution layers in microelectronic devices and microelectronic device packaging, microelectromechanical systems (MEMS) and in optoelectronic devices. In particular, norbornene-type polymers have been found to be valuable for such uses. For example, films formed from such polymers have found use in thin-film transistor type liquid crystal displays (TFT LCD) and organic electro-luminescence (OEL) devices to insulate the elements or wiring and/or to planarize device surfaces, and in some cases serve to form projections over a display electrode surface for orientation control of liquid crystal molecules in LCD devices or as spacers between electrodes in OEL and LCD devices. Further, films formed from such polymers are also useful in mounting semiconductor devices on printed wiring boards or other mounting substrates where such films serve to insulate between the semiconductor device and the circuitry of such board or substrate as well as serving to attach such devices to such board or substrate.

To be effective in the aforementioned exemplary uses, the films or structures formed must be able to withstand subsequent processing while maintaining their desirable properties during the useful life of device within which they are incorporated. Where such materials are used in optical applications such as displays and/or optical semiconductor devices, the materials must also form films that are highly transparent at appropriate wavelengths of light.

While in the past various materials have been found useful for some of the applications described above, the higher integration and/or miniaturization of displays, semiconductor devices and printed wiring boards has shown that the continued use of such previously known materials is problematic and/or limited. For example, while currently known polyimide resins generally have adequate high temperature performance, they do not have a low enough permittivity to be effective in highly integrated and/or miniaturized devices having increased wiring density and high signal speed. In addition, polyimide resins are generally not transparent enough for many optical applications. One such known polyimide material is the positive type photosensitive resin encompassing a polyimide precursor and a diazoquinone-type compound disclosed in Japanese Patent No. 3,262,108.

Other currently known materials, such as the acrylic resin based radiation-sensitive composition disclosed in Laid-open Japanese Patent Application No. Hei 5-165214 or the alicyclic olefin resin disclosed in Laid-open Japanese Patent Application No. 2003-162054 are also problematic or limiting in that while exhibiting adequate transparency, such resins do not have adequate heat resistance to withstand subsequent processing.

Recently U.S. Pat. No. 7,022,790 described a negative-tone norbornene-type polymer that can be provided as a self-imageable composition and which is the basis of a family of resin compositions (Avatrel® (Promerus LLC)). While this family of products has gained commercial success, due in significant part to its ability to form thick self-imageable films ($\geq 30$ µm), such success has been limited by its requirement for a solvent based image development process which differs from the more commonly employed aqueous base development process (employing 0.26N TMAH (tetramethylammonium hydroxide)) used for fabricating the aforementioned devices.

More recently, U.S. Pat. No. 7,524,594 ('594 patent), disclosed an aqueous base developable positive-tone Avatrel® resin composition ('594 resin) that has been shown to be appropriate for use in many of the aforementioned applications. However, the use of such '594 resin has proven to be limited to applications that only require the formation of relatively thin polymer films, for example films having a thickness of 20 microns (µm) or less, and where the aspect ratios obtained after imaging, do not exceed about 5 to 1.

Therefore it would be advantageous to have a resin composition that can be used for forming films having a thickness of 30 µm or greater where such films are highly transparent, have a low permittivity (less than or equal to that of thermal silicon oxide) and have high heat resistance (sufficient to withstand subsequent processing). Further, it would be advantageous if such a resin composition was self-imageable, that is to say that portions of films formed therefrom respond directly to an image-wise exposure to form a patterned film. Further still, it would be advantageous for such a self-imageable resin composition to employ an aqueous base developer, such as an aqueous alkali solution, for the development of the aforementioned pattern.

BRIEF DESCRIPTION OF THE DRAWINGS

Embodiments in accordance with the present invention are described hereinbelow with reference to the following accompanying drawings.

DETAILED DESCRIPTION

Figure 1:
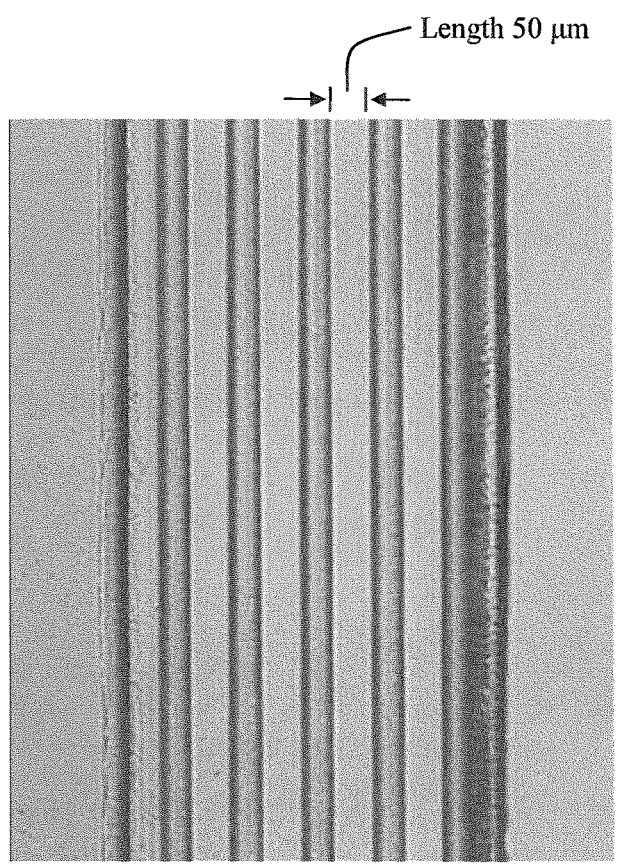
FIG. 1 is an optical microphotograph demonstrating self-imageability of a polymer composition embodiment in accordance with the present invention.

Embodiments in accordance with the present invention are directed to norbornene-type polymers, self-imageable compositions that encompass such polymers and the films, layers and structures that can be formed using such polymers and compositions. Advantageously, such self-imageable compositions can provide images after image-wise exposure of a film formed thereof followed by development of such images using an aqueous base developer solution such as one that encompasses tetramethylammonium hydroxide (TMAH).

Further, such embodiments can routinely provide films of 30 micro meters or greater and images demonstrating aspect ratios in excess of 6 to 1.

It should be noted that polymers encompassed by the polymer compositions in accordance with the present invention are generally disclosed in the previously mentioned '594 patent. Further, it should be noted that the limitations of the polymer compositions of the '594 patent in providing high aspect ratio (>5:1) thick (≥30 μm) polymer films lead to the research effort that resulted in the advantageous and unexpected results presented hereinafter. Therefore, the polymer compositions of the present invention are distinct from those of the '594 patent.

Unless otherwise indicated, all numbers, values and/or expressions referring to quantities of ingredients, reaction conditions, etc., used herein are to be understood as modified in all instances by the term "about" as absent the aforementioned indication, such numbers are approximations reflective of, among other things, the various uncertainties of measurement encountered in obtaining such values. Further, where a numerical range is disclosed herein such range is continuous, and includes every value between the minimum and maximum values of such range. Still further, where a range refers to integers, every integer between the minimum and maximum values of such range is included. In addition, where multiple ranges are provided to describe a feature or characteristic, such ranges can be combined to further describe such a feature or characteristic.

It will be understood that the teams "dielectric" and "insulating" are used interchangeably herein. Thus reference to an insulating layer is inclusive of a dielectric layer.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that some small amount generally remains with the polymer when it is transferred between vessels or between solvents or dispersion media.

As used herein, the term "polymer composition" is meant to include one or more synthesized polymers, as well as materials added after synthesis of the polymer(s) to provide or modify specific properties of such composition. Exemplary materials that can be added include, but are not limited to, solvents, antioxidants, photoacid generators, photosensitizers, crosslinking moieties, reactive diluents, acid scavengers, adhesion promoters, and plasticizers.

As used herein, "hydrocarbyl" refers to a radical of a group that contains only carbon and hydrogen, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, "alkyl" refers to a linear or branched acyclic or cyclic, saturated hydrocarbon group having a carbon chain length of, for example, from $C_1$ to $C_{25}$. Non-limiting examples of suitable alkyl groups include, but are not limited to, $-(CH_2)_3CH_3$, $-(CH_2)_4CH_3$, $-(CH_2)_5CH_3$, $-(CH_2)_{10}CH_3$, $-(CH_2)_{23}CH_3$, cyclopentyl and cyclohexyl.

As used herein the term "aryl" refers to aromatic groups that include, without limitation, groups such as phenyl, biphenyl, benzyl, xylyl, naphthalenyl, anthracenyl and the like.

The terms "alkaryl" or "aralkyl" are used herein interchangeably and refer to a linear or branched acyclic alkyl group substituted with at least one aryl group, for example, phenyl, and having an alkyl carbon chain length of $C_1$ to $C_{25}$. It will further be understood that the above acyclic alkyl group can be a haloalkyl or perhaloalkyl group.

As used herein the term "alkenyl" refers to a linear or branched acyclic or cyclic hydrocarbon group having one or more double bonds and having an alkenyl carbon chain length of $C_2$ to $C_{25}$. Non-limiting examples include, among others, vinyl groups, propylene, butenes and the like.

As used herein the term "heterohydrocarbyl" refers to any of the previously described hydrocarbyls, halohydrocarbyls and perhalohydrocarbyls where at least one carbon of the carbon chain is replaced with N, O, S, Si or P. Non-limiting examples include heterocyclic aromatic groups such as pyrrolyl, furanyl, and the like, as well as non-aromatic groups such as ethers, thioethers and silyl ethers. The term "alkylol" refers specifically to heteroalkyl groups that include one or more hydroxyl groups.

It will additionally be understood that any of the hydrocarbyl, halohydrocarbyl and perhalohydrocarbyl moieties, or their "hetero" analogs, described above can be further substituted, if desired. Non-limiting examples of suitable substituent groups include, among others, hydroxyl groups, benzyl groups, carboxylic acid and carboxylic acid ester groups, amides and imides.

As used herein, the terms "polycycloolefin", "poly(cyclic) olefin", and "norbornene-type" are interchangeably used to refer to addition polymerizable monomers, the resulting repeating units in the resulting polymers or the compositions that encompass such polymers, where such monomers, repeating units and polymers encompass at least one norbornene-type moiety. The simplest norbornene-type polymerizable monomer encompassed by embodiments in accordance with the present invention is norbornene itself, bicyclo [2.2.1]hept-2-ene, as shown below:

However, the term norbornene-type monomer, repeating unit or polymer as used herein is not limited to such moieties that encompass only norbornene itself, but rather to any substituted norbornene(s), or substituted and unsubstituted higher cyclic derivatives thereof as will be described more fully below.

Structural Formula I, shown below, is representative of such norbornene monomers and Structural Formula Ia of corresponding repeating units:

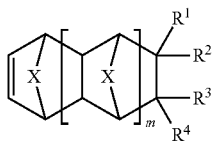

I

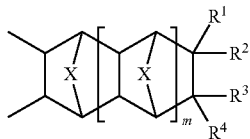

Ia where for each of formulae I and Ia, X is selected from —CH$_2$—, —CH$_2$—CH$_2$, O and S; m is an integer from 0 to 5 and each occurrence of R$^1$, R$^2$, R$^3$ and R$^4$ independently represents hydrogen, a hydrocarbyl or another substituent.

Norbornene-type polymers present in the film compositions in accordance with the present invention are derived from a 2,3 enchainment polymerization process (also known as vinyl addition polymerization) and have at least two distinct types of repeat units in accordance with Structural Formula Ia, where for each repeating unit X is selected from —CH$_2$—, —CH$_2$—CH$_2$—, or —O—; m is an integer from 0 to 5; and each of R$^1$, R$^2$, R$^3$, and R$^4$ are independently selected from hydrogen or a hydrocarbyl group as described below.

For exemplary embodiments in accordance with the present invention, a first of the at least two distinct types of repeating units in accordance with Structural Formula Ia encompasses a carboxylic acid containing hydrocarbyl pendent group. That is to say, that one of R$^1$-R$^4$ is represented by the formula —R$^5$COOH, where R$^5$ is a C$_1$ to C$_6$ alkyl moiety. For example, the carboxylic acid containing pendent group —CH$_2$CH$_2$COOH. As will be discussed below, carboxylic acid pendent groups are generally useful for participating in a reaction, with appropriately selected additives or repeating units, that lead to the formation of an image. It should be noted that such a condensation reaction can encompass crosslinking that will provide for the self-imageability of the polymer embodiments of the present invention and is initiated when a film encompassing such a polymer and an appropriate photosensitive additive is image-wise exposed to an appropriate form of actinic radiation.

For such exemplary embodiments, a second of the at least two distinct types of repeat units in accordance with Structural Formula Ia encompasses a pendent hydrocarbyl group having a dissociable hydrogen atom with a pK$_a$ less than about 11. For example, one of R$^1$-R$^4$ is a pendent group having a structure in accordance with one of formulae B, C or D:

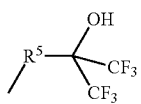

B

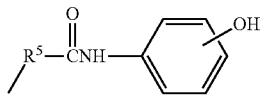

C

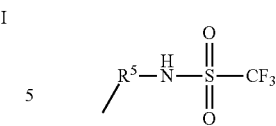

D where R$^5$, is as described above.

In some embodiments where the second repeating unit encompasses a pendent group in accordance with formula B, R$^5$ is —CH$_2$CH$_2$OCH$_2$— such repeating unit can be named norbornenylethoxy 2-trifluoromethyl-3,3,3-trifluoropropan-2-ol (or norbornene ethoxymethylhexafluoropropanol, NBE-MHFP). In other embodiments R$^5$ of such second repeating unit is —CH$_2$—, and such repeat unit can be named norbornenyl-2-trifluoromethyl-3,3,3-trifluoropropan-2-ol (HFANB).

In alternate embodiments of the present invention where such second repeat unit encompasses a pendent group corresponding to Formula C, R$^5$ is generally an alkyl of one or more carbons and the hydroxyl is ortho or para to the position of the amide. In other alternate embodiments where such second repeat unit encompasses a pendent group corresponding to Formula D, R$^5$ is generally an alkyl of one or more carbons. Generally, such second repeating units are useful for providing a desired degree of solubility for regions of the aforementioned polymer film that are not exposed to the aforementioned actinic radiation during said image-wise exposure and possibly to participate in the aforementioned reaction that leads to the formation of the image in other regions of the film that are exposed to the actinic radiation.

In embodiments in accordance with the present invention that encompass only a first and a second repeating unit, generally such repeating units are dispersed along the polymer backbone in an essentially random manner. Further, for some embodiments, the first repeating unit encompasses from 5 to 40 percent of the polymer's repeating units. In other embodiments, such first repeating unit encompasses from 20 to 60 percent of the polymer's repeating units and in still other embodiments from 30 to 90 percent of such repeating units. It will of course be realized where the aforementioned embodiments are limited to just first and second repeating units, the second repeating unit is present in an amount such that the percentage of repeating units present is 100 percent. Further, it should be realized that the specific amounts of such first and second repeating units present in a specific embodiment of the present invention and the specific nature of the pendent groups selected for each type of repeating unit are selected to achieve specific properties of a final imaged film and/or the imaging performance required for a specific application. Thus, for example, where a high degree of solubility of unexposed regions is desired, embodiments in accordance with the present invention can be prepared having an enhanced percentage of the first type of repeating unit or alternately a pendent group for second repeating unit can be selected that would provide such a high degree of solubility without such an enhanced percentage of the first repeat unit. For example, an alternate second repeating unit with a lower pKa can be selected to provide higher solubility of the unexposed regions of the polymer film without changing the relative percentages of the first and second repeating units.

Some embodiments in accordance with the present invention encompass repeating units in addition to the first and second types of repeating units described above, where such additional repeating units are generally directed to providing advantageous characteristic and/or properties to polymer composition embodiments, imageable film embodiments and embodiments in accordance with the present invention that encompass the structures ultimately formed by image-wise exposure of such films. Such additional types of repeating units include, but are not limited to, repeating units derived from $C_4$ to $C_{10}$ linear or cyclic alkyl epoxy norbornenes, $C_1$ to $C_{12}$ alkylnorbornenes, di, tri and tetraoxa $C_1$ to $C_{12}$ alkylnorbornenes, $C_4$ to $C_{10}$ glycidyl ether norbornenes, $C_4$ to $C_{12}$ oxetane or silyloxetane norbornenes, and antioxidant-containing norbornenes. For ease of understanding and without limitation, the following exemplary structural representations of the above norbornenes are provided:

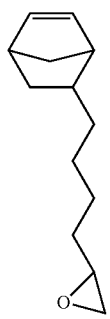
E

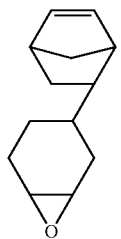
F

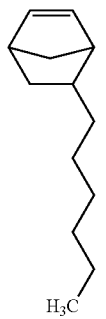
G

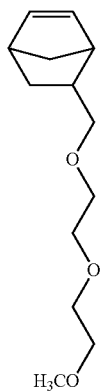
H

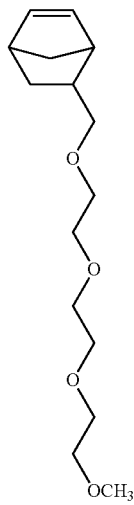
I

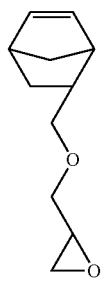
J

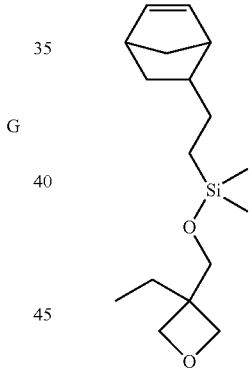
K

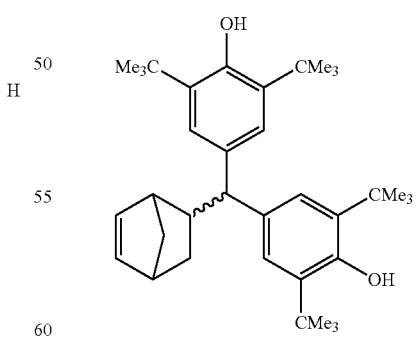
L where E is epoxyhexylnorbornene (EHNB), F is epoxycyclohexanenorbornene (ECyNB), G is hexylnorbornene (HexNB), H is trioxanonanenorbornene (NBTON), I is tetraoxadodecanenorbornene (NBTODD), J is methylglycidylethernorbornene (MGENB), K is [(3-ethyl-3-oxetanyl)

methoxy]dimethylnorbornenylethylsilane (NBEtDMSiOxetane) and L is 5-norbornene-2-yl(methylene)-4,4'-bis-(2,6-di-tert-butylphenol), (AOAONB).

Synthesis of Norbornene-Type Polymers from Monomers

Polymers of the norbornene-type monomers described are generally formed via a 2,3 enchainment (vinyl-addition) polymerization reaction in the presence of nickel or palladium complexes which serve as catalysts. Examples of appropriate nickel and palladium catalysts and polymerization reactions in which they are employed are disclosed in U.S. Pat. No. 6,790,579 B1 and U.S. Pat. No. 6,903,171 B2, which are incorporated herein by reference. In addition, U.S. Pat. No. 7,524,594 ('594 patent) also provides, at column 9, line 26 through column 13, line 38, a description of polymerization catalysts, conditions, monomer ratios and polymer isolation methodology that is particularly pertinent to a thorough understanding of the polymer embodiments of the present invention and therefore such portion of the '594 patent are also incorporated by reference herein.

When a nickel complex is used to catalyze the vinyl-addition polymerization, the nickel complex can have a structure represented by the formula:

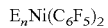

$E_n Ni(C_6F_5)_2$ where n is 1 or 2, and E is a hydrocarbyl ligand having a heteroatom containing a free-electron pair capable of donating two electrons to Ni, typically N or O, or an aromatic ligand wherein the pi electron system is capable of donating electron density to Ni. Exemplary E ligands can encompass toluene, THF, ethyl acetate, and dioxane.

Palladium complexes suitable for the polymerization of the above-described monomers include those represented by formula:

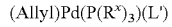

(Allyl)Pd(P(R$^x$)$_3$)(L')

where Rx is selected from isopropyl and cyclohexyl and L' is selected from trifluoroacetate and trifluoromethanesulfonate (triflate). Representative Pd compounds encompass (allyl)palladium(tricyclohexylphosphine)triflate, (allyl)palladium(triisopropylphosphine)triflate, (allyl)-palladium (tricyclohexylphosphine)trifluoroacetate, and (allyl)palladium(triisopropylphosphine)trifluoroacetate. The described palladium complexes can be admixed with a Group 15 electron donor and/or a labile neutral electron donor compound to form a catalytically competent palladium complex prior to polymerization.

The molecular weight of a norbornene-type polymer can be readily controlled through adjustment to the reaction conditions. Changing the ratio of catalyst to monomer can serve to control the resulting polymer's molecular weight. Adjusting the level of a chain transfer agent (CTA) present in the polymerization reaction also affects molecular weight. CTAs useful in synthesizing norbornene-type polymers are found in U.S. Pat. No. 6,136,499, which is incorporated herein by reference. Exemplary CTAs encompass alpha-olefins such as 1-hexene, and non-olefinic compounds such as hydrogen, alkylsilanes such as triethylsilane, alkylalkoxysilanes as disclosed in U.S. Published Patent Application No. 2004/0229157 and U.S. Published Patent Application No. 2007/0066775, which are incorporated herein by reference. Further, for some polymer embodiments in accordance with the present invention, the use of a single moiety to be both a CTA and an activating agent, generally referred to as a CTAA, can prove effective to both control the molecular weight and optical density of the desired polymer as well as the yield of such polymer obtained. Such CTAA's, the methods of their use and polymerization reaction conditions and results are disclosed in U.S. Published Patent Application No. 2008/0242810 which is incorporated herein by reference.

Generally, and regardless of which of the above methods are used to form the polymer embodiments of the present invention, some such embodiments have an average molecular weight (Mw) from 20,000 to 350,000 Daltons (Da). In other embodiments, the Mw of the norbornene-type polymers are from 30,000 to 275,000 Da. In yet other embodiments, the Mw of the norbornene-type polymers are from 35,000 to 50,000 Da. Additionally, the ratio of average molecular weight to number average molecular weight (Mn), also known as Polydispersity (PD) of norbornene-type polymers made in accordance with the polymerization methods of the present invention are approximately 2, but can vary from 1 to 4.

It should be noted that for the polymerization of the first type of norbornene monomer with one or more other monomers, generally such first type of monomer is provided with a protecting or blocking group substituting for the acidic hydrogen of the carboxylic acid to ensure the highest possible polymerization yield. Exemplary blocking or protecting groups encompass tertiary butyl groups, a t-butoxycarbonyl group, a tetrahydropyran-2-yl group, a trialkylsilyl group such as a trimethylsilyl group, a methylmethoxy group, or an alkyl group to form an ester with the carboxylic acid, such as —$C_2H_5$. Once the polymerization is complete, and generally during the isolation and purification of the resulting polymer, the carboxylic acid group is regenerated by hydrolysis.

Self-imageable, film forming composition embodiments in accordance with the present invention encompass a norbornene-type polymer, a photo acid generator, an optional photosensitizer and one or more optional cross-linking moieties. To allow for the formation of a cross-linked network of the norbornene-type polymer within regions of a film formed of such a composition exposed to actinic radiation and subsequent heating, the first repeating unit of norbornene-type polymers included in the film compositions is selected to be reactive, in the presence of a strong acid such as is formed by the photo acid generator, with any included cross-linkable moieties and/or capable of undergoing a condensation-type of reaction with itself or with another repeating unit of the polymer.

Thus it has been unexpectedly found, that the polymer embodiments described herein, when formulated into a polymer composition that includes a only photosensitive moieties such as a photo acid generator (PAG) and photosensitizer dissolved in a casting solvent, are directly photoimageable. That is to say, that when such a polymer composition is cast onto a substrate to form a film and then subsequently imagewise exposed to actinic radiation of the appropriate wavelength, the polymer can enter into what is believed to be a condensation reaction that leads to the formation of a structure only within radiation exposed portions of the film. Further, it has been found that after unexposed portions of the film are removed, for example by an aqueous base developer, and the remaining portions heated to an appropriate temperature for an appropriate period of time, such remaining portions are configured as a negative of the image employed in for the image-wise exposure to actinic radiation. Referring to FIG. 1, an optical microphotograph of such an exposed and developed film is shown. The polymer composition used to form the imaged film had 100 parts per hundred (pphr) of a 75/25 HFANB/NBCH$_2$CH$_2$CO$_2$H, polymer (Mw=150,400 Dalton (Da); PDI=2.05) as a 25 weight percent (wt %) solution in propyleneglycol methylether acetate (PGMEA) as well as 2 pphr of the PAG Rhodorsil PI 2074 ((p-isopropylphenyl)(p-methylphenyl)-iodonium tetrakis(pentafluorophenyl)borate) and 1 pphr of the photosensitizer CPTX (1-chloro-4-propoxy-9-H-thioxanthen-9-one) which was cast to a thickness of approximately 10 microns on a 5 inch $SiO_2$ coated silicon wafer and exposed with an energy of 776 $mJ/cm^2$. The imageability of this formulation is obvious.

Without wishing to be bound by theory, it is believed that in the exposed portions of the film, the exposed PAG, which is known to form a strong acid from such exposure, induces a reaction of the first type of repeating units, for example $NBCH_2CH_2CO_2H$, with other repeating units of either the same or different type. Further it is believed that heating such exposed and remaining portions serves to drive this condensation reaction to completion in those exposed portions and form what is believed to be a cross-linked polymer matrix.

Additives

As discussed with reference to FIG. 1, an imageable polymer composition in accordance with embodiments of the present invention encompasses a polymer that encompasses at least the first and second types of repeating units described above, a photoacid generator (PAG) and a solvent used to form a solution of the aforementioned polymer and PAG and allow for such polymer composition to be cast onto a substrate in any appropriate manner capable of forming a layer thereon where such layer has an essentially uniform thickness. Additionally, where optional additives are included in polymer composition embodiments, the solvent solution will also include such additives. Such appropriate casting manners include, but are not limited to, spin coating, spray coating, roller coating and the use of a doctor blade.

Solvents

Useful casting solvents include, but are not limited to, N-methyl-2-pyrrolidone, gamma-butyrolactone, N,N-dimethylacetamide, dimethylsulfoxide, diethyleneglycol dimethylether, diethyleneglycol diethylether, diethyleneglycol dibutylether, propyleneglycol monomethylether, dipropylene glycol monomethylether, methyl lactate, ethyl lactate, butyl lactate, methylethyl ketone, cyclohexanone, tetrahydrofuran, methyl-1,3-butyleneglycolacetate, 1,3-butyleneglycol-3-monomethylether, methyl pyruvate, ethyl pyruvate, methyl-3-methoxypropionate and mixtures thereof. It has been found that propyleneglycol monomethylether, propyleneglycol monomethylether acetate, gamma-butyrolactone, and cyclohexanone either alone or in combination are advantageous cast solvents. Additionally, such a casting solvent has appropriate volatility to allow for the formation of a film on such surface after the composition has been cast thereon.

Photo Acid Generator and Photosensitizers

As mentioned above, the polymer composition embodiments in accordance with the present invention, include a photo acid generator (PAG) and can optionally include a photosensitizer. Exemplary PAGs include, but are not limited to, (p-isopropylphenyl)(p-methylphenyl)-iodonium tetrakis (pentafluorophenyl)borate (Rhodorsil PI 2074, Rhodia, Inc.) and TAG 382 (Toyo Ink):

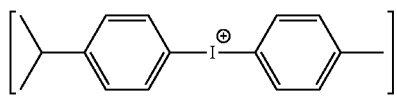

-continued

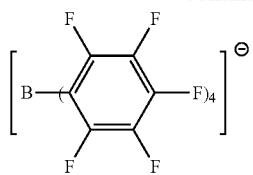

Rhodorsil 2074, Photo acid generator
CAS 178288-72-2

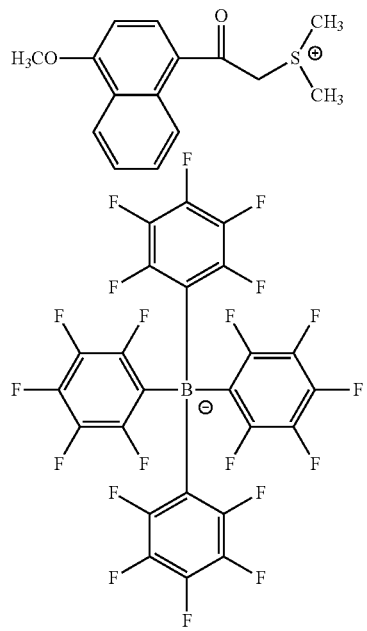

TAG 382
$C_{39}H_{17}BF_{20}O_2S$
Mol. Wt: 940.40

PAGs generally absorb actinic radiation over a broad range of wavelengths while in modern photoexposure tools, a limited range of wavelengths or even a single wavelength, is provided. Therefore, in addition to a PAG, a photosensitizer can be included within the polymer composition where such material is selected to be absorbing at a wavelength(s) used for the image-wise exposure. While any appropriate photosensitizer can be employed, a useful photosensitizer for exposure at wavelengths that include 248 nanometers includes CPTX, the structure, name and CAS number of which is shown below:

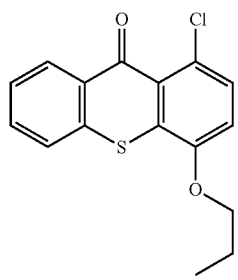

CPTX, photosensitizer
1-chloro-4-propoxy-9-H-thioxanthen-9-one
CAS 142770-42-1

The amount of PAG and photosensitizer included in the polymer composition embodiments of the present invention is generally in the range of range of 0.05 pphr to 10 pphr where the polymer is taken as being 100 pphr in the composition. Additionally, the ratio of PAG to photosensitizer is generally 2:1. It should be noted that the specific amount of PAG and photosensitizer used will of course be a function of the specific materials selected as well as other factors which include, among others, a desired photo-speed and film thickness.

Cross-Linkers

While some embodiments of useful polymer compositions in accordance with the present invention encompass one or more optional moieties capable of cross-linking with the first type of repeating unit included in the polymer employed, the discovery that such additional moieties are not required for imaging a polymer, for example by forming a cross-linked polymer matrix, is believed to be previously unknown (See, FIG. 1). Thus the inclusion of cross-linking moieties in polymer composition embodiments of the present invention is not a requirement for providing a developable image after an image-wise exposure and a post exposure thermal process.

However, some polymer composition embodiments of the present invention can employ such cross-linker additives which generally encompass one or more epoxide, oxetane, terminal vinyl ether groups covalently bonded to the hydrocarbyl backbone of the additive. Exemplary materials capable of cross-linking (cross-linkable) with the pendant carboxylic acidic group of the first repeating unit include Trimethylolpropane triglycidyl ether (TMPTGE) CAS#: 3454-29-3

Poly(propylene glycol)diglycidyl ether (PPGDG) CAS# 26142-30-3

Cyracure UVR 6105, CAS# 2386-87-0

Cyracure UVR 6128, CAS# 3130-19-6

DMS-E09 Mw = 383 CAS# 126-80-7

Heloxy 84 CAS# 37237-76-6

Heloxy 107 CAS# 14228-73-0

Hexandlol diglycidylether (HDGE), CAS# 16096-31-4

Tetrakis(methoxymethyl)glycoluril, Powderlink 1174, CAS 17464-88-9

Cyclohexane 1,4-dimethanol divinyl ether 1,1,1-Trimethanol propane trivinyl ether Tri-propylene glycol divinyl ether Tri-ethylene glycol divinyl ether 3-Methacryloxymethyl-3-ethyloxetane; OXMA; CAS 37674-57-0

3-Ethyl-3-phenoxymethyloxetane, OXT-211, CAS 3897-65-2

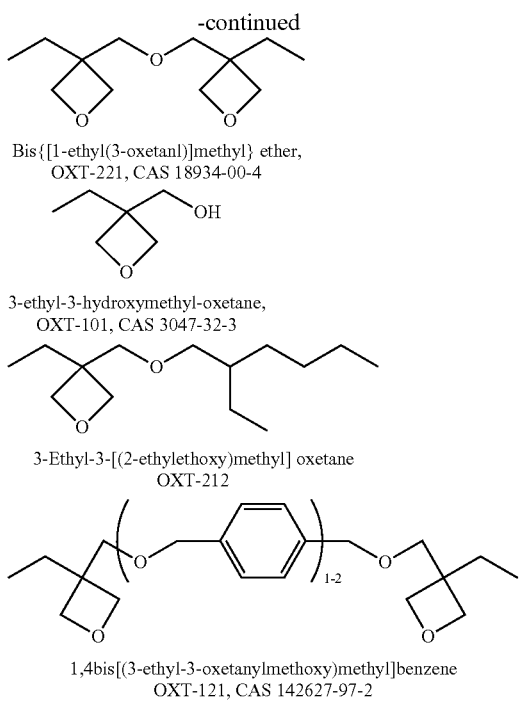

Bis{[1-ethyl(3-oxetanl)]methyl} ether,
OXT-221, CAS 18934-00-4

3-ethyl-3-hydroxymethyl-oxetane,
OXT-101, CAS 3047-32-3

3-Ethyl-3-[(2-ethylethoxy)methyl] oxetane
OXT-212

1,4bis[(3-ethyl-3-oxetanylmethoxy)methyl]benzene
OXT-121, CAS 142627-97-2

Other useful cross-linking moieties include methylated urea cross-linkers such as tetrakis(methoxymethyl)glycoluril (Powderlink 1174 or Nikalac MX 270) 4,5-dimethoxy-1,3 bis(methoxymethyl)imidazolidin-2-one (Nikalac MX 280) Tetrakis(butoxymethyl)glycoluril Tetrakis(ethoxymethyl)glycoluril Tetrakis(isopropoxymethyl)glycoluril Tetrakis(amyloxymethyl)glycoluril Tetrakis(hexoxymethyl)glycoluril. In addition, methylated melamine cross linkers such as 1,3,5-Triazine-2,4,6 triamine, N2,N2,N4,N4,N6,N6-hexakis(methoxymethyl) [Nikalac MW 390] and a methylated melamine formaldehyde polymer under trade name Cymel 301 are useful. Further, additional oxetane cross linkers such as 3-methacryloxymethyl-3-ethyloxetane (OXMA from UBEIndustries), 3-ethyl-3 phenoxymethyloxetane, Bis (1-ethyl(3-oxetanyl)methyl)ether, 3-ethyl-3hydroxymethyl oxetane, 3-ethyl3-(2ethylethoxy)methyl oxetane, 1,4, bis[(3-ethyl-3-oxetanylmethoxy)methyl]benzene (Oxt-121 from Toa Gosei Co Ltd), (4,4'-bis[3-ethyl-3oxetanyl)methoxymethyl]biphenyl) (OXBP from UBE Industries, Ltd) and bis [(3-ethyl-3-oxetanyl)methyl]isophtalate) (OXIPA from UBE Industries, Ltd) are useful.

While some polymer composition embodiments in accordance with the present invention will encompass one of the above exemplary cross-linking additives, it should be noted that other embodiments encompass two or more of such moieties. With regard to the amount of the one or more cross-linking additives generally employed, such total amount is generally between 0 and 80 pphr where the amount of polymer employed is taken as being 100 pphr. In other embodiments such total amount can be from 1 to 50 pphr and in still other embodiments from 5 to 25 pphr. Those skilled in the art will recognize that since it has been demonstrated that the inclusion of cross-linking additives to a polymer composition embodiment of the present invention is optional for providing an imageable film, the actual amount of such additives actually employed is essentially a design choice that is a function of the specific use intended for any polymer composition. Thus factors such as a desired photo-speed, film thickness and the final use and physical/electrical properties (including dielectric strength, modulus and adhesion to a specific substrate) of the structures formed from such polymer compositions should generally be considered to determine whether or not to include a cross-linking additive, the amount of such additive if employed and of course the selection of which of the many possible additives is appropriate for any specific application. Where the aforementioned factors are known, the determination of whether or not to use a cross-linking additive, if used which additive(s) to use and the total amount of such additive(s) is believed to not require undue experimentation.

Additionally, whether or not a cross-linking additive is used, the process of imaging films formed using a polymer composition embodiment of the present invention generally employs a heating step after the casting of the composition onto a substrate and before such cast composition is image-wise exposed. Such a heating step is generally referred to as a "soft bake" and for some embodiments at a temperature between 50° C. and 125° C., while for other embodiments at a temperature between 75° C. and 110° C. and for still other embodiments at a temperature between 80° C. and 100° C. After image-wise exposure and before contact with the aqueous base developer, a second heating, generally referred to as "post exposure bake" (PEB) is performed. For some embodiments the PEB is performed at a temperature in the range of 90° C. and 110° C. while for some embodiments at a temperature in the range of 100° C. and 120° C. and for still other embodiments at a temperature between 115° C. and 145° C. After the PEB heating is completed, removal of unexposed regions of the composition is accomplished through contacting the composition with an aqueous base developer solution such as 0.26N TMAH. After sufficient contact with the developer solution, the now patterned composition or film is rinsed to remove any residual developer and then subjected to a third heating to drive any condensation or cross-linking reaction to completion within the remaining portions. In some embodiments, such a heating step employs a temperature from 120° C. to 300° C. while in other embodiments a temperature from 140° C. to 250° C. is used and in still other embodiments from 150° C. to 200° C. can be selected. For each of these temperatures, the heating is maintained for a time appropriate to complete such condensation or cross-linking reaction.

Further, the polymer compositions of the present invention are generally applied to a substrate in a thickness within the range from 1 to 60 µm. Where films having a thickness greater than 60 µm are needed, while possible to form with a single casting step, it has been found that such films are advantageously prepared by multiple coatings. The self-imageable films disclosed herein are particularly suitable for thick film imaging, where a thick film has a thickness greater than about 30 µm. In some embodiment, the thickness of a thick film is from 1 to 200 µm. In another embodiment, the thickness of a thick film is from 30 to 100 µm. In yet another embodiment, the thickness of a thick film is from 20 to 60 µm. While the self-imageable films disclosed herein are particularly suitable for thick film imaging, the film compositions disclosed herein are also suitable for forming thinner films including films less than 30 µm in thickness and including films having a thickness from 0.5 to 30 µm.

Other Additives

The polymer composition embodiments in accordance with the present invention can include one or more other additives such as adhesion promoters, antioxidants, reactive diluents and plasticizers. Exemplary adhesion promoters include trialkoxysilyl derivatives such as the trimethoxysilyl and triethoxysilyl compounds:

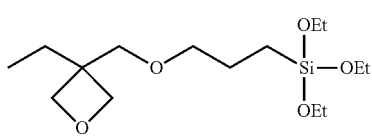

3-ethyl-[(triethoxysilylpropoxy)methyl oxetane
OXT-610, CAS 3897-65-2

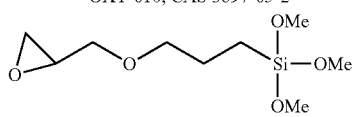

3-glycidyloxypropyl)trimethoxy silane
CAS 2530-83-8 and (3-glycidyloxypropyl)trimethoxy silane is sold under the trade name Silquest® A-187 by Crompton Corp. Other useful adhesion promoters include, but are not limited to, 3-glycidoxypropyl trimethoxysilane (KBM-403 or Silquest A-187), 3-glycidoxypropyl triethoxysilane, 2-(3,4 epoxycyclohexyl) ethyl trimethoxysilane, 2-(3,4 epoxycyclohexyl)ethyl triethoxysilane, 5,6 epoxyhexyltriethoxysilane, 3-glycidoxypropylmethyldiethoxysilane, 3-glycidoxypropylmethyldimethoxysilane, 3-glycidoxypropyldimethylethoxysilane, Bis-(2-hydroxyethyl)-3-aminopropyltriethoxysilane, bis(3-(triethoxysilyl)propyl) disulfide (Si-75, Si-266), 3-mercaptopropyltrimethoxysilane (Silquest 1891), and organoalkoxysilanes NXT*Z-100, NXT*Z-45 (from Momentive Performance Materials). It should be noted that the choice of a specific adhesion promoter is generally a function of the substrate surface to which the polymer composition is to be applied.

Other exemplary additives that can be optionally added to polymer composition embodiments of the present invention include, among others, the group encompassing tetrakis[methylene(3,5-di-tert-butyl-4-hydroxyhydrocinnamate)]methane and octadecyl-3,5-di-tert-butyl-4-hydroxyhydrocinnamate (Irganox™ 1010 and 1076 from Ciba Specialty Chemicals), and other sulfur-containing phenolic compounds (antioxidants); 1-adamantanol (reactive diluents); poly(propylene glycol) and polyether poly-ol (plasticizers); and 3,3'-bis(triethoxysilylpropyl) disulfide and 3-glycidoxypropyl trimethoxy silane (Si 75 and 3-GTS, respectively) (adhesion promoters). In some polymer composition embodiments, the aforementioned one or more optional additives are included in the composition, in total, from 1 pphr to 50 pphr where the polymer is taken as being 100 pphr in the composition. In other such embodiments such optional additives are from 5 pphr to 35 pphr. Again, it should be noted that for any specific polymer composition embodiment, the actual amounts of optional additives employed, if any, will be a function of many factors, including, but not limited to, the specific additives selected and the specific use to which the polymer composition is directed.

As mentioned briefly above, the polymer composition embodiments of the present invention can be cast onto a surface of a substrate to form a film. Such films are negative tone, self-imageable films that are useful for providing protective, dielectric, passivation, sacrificial and redistribution layers in microelectronic devices and microelectronic device packaging, microelectromechanical systems (MEMS) and in optoelectronic devices and displays. For example, liquid crystal (LCD) and organic light emitting diode (OLED) displays.

Figure 2:
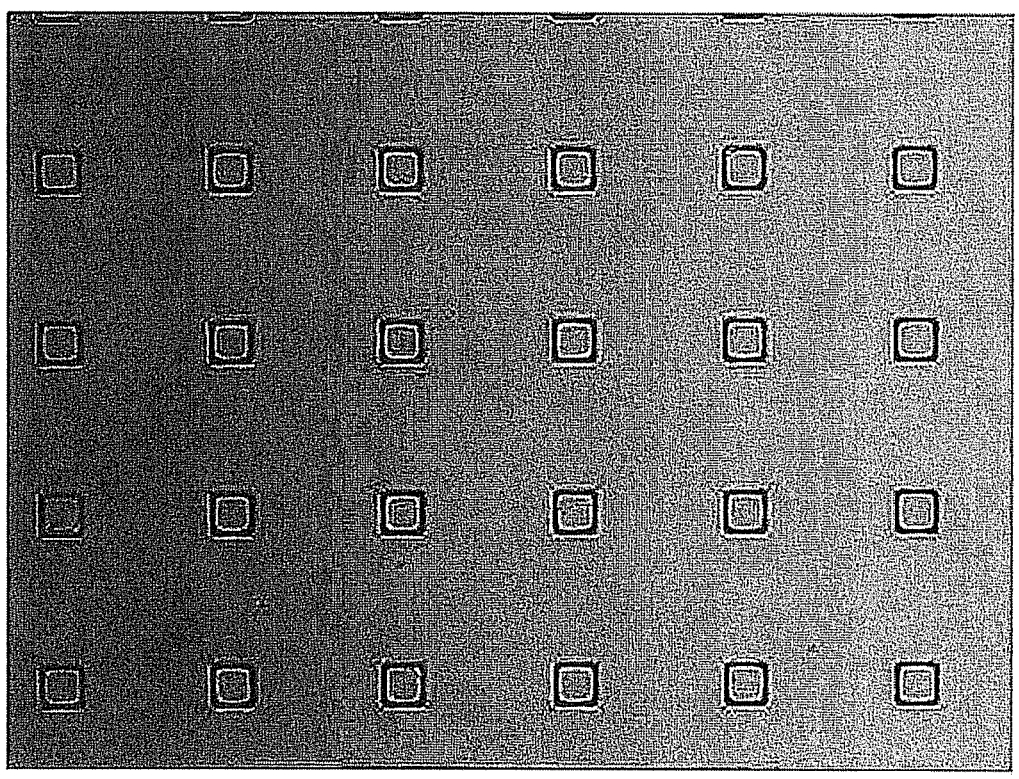
FIGS. 2 and 3 are optical microphotographs demonstrating self-imageability of other polymer composition embodiments in accordance with the present invention.
Figure 3:
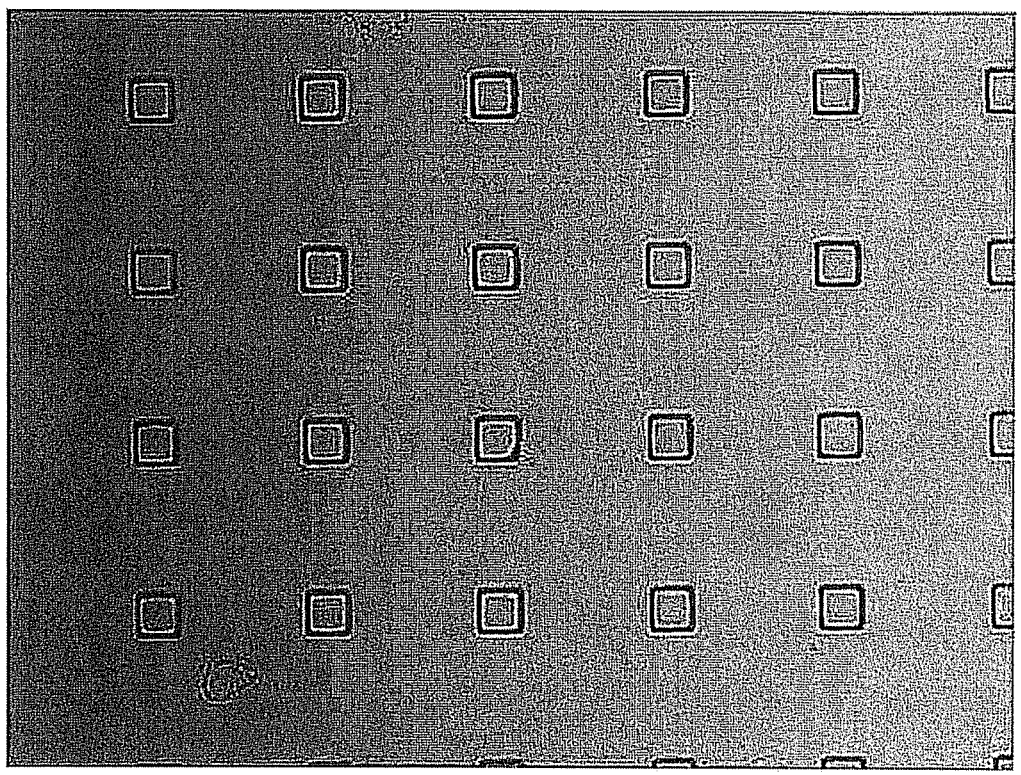

Referring now to FIGS. 2 and 3, photomicrographs of polymer compositions in accordance with the present invention are show after having been cast onto a $SiO_2$ coated 5 inch silicon wafer to a thickness of approximately 30 microns and then image-wise exposed with the energy indicated in each figure to resolve 50 micron square via openings as seen. The polymer composition seen in FIG. 2, was 100 parts per hundred (pphr) of a 75/25 HFANB/NBCH$_2$CH$_2$CO$_2$H, polymer (Mw=150,400 Dalton (Da); PDI=2.05) as a 25 weight percent (wt %) solution in propyleneglycol methylether acetate (PGMEA) as well as 1 pphr of the PAG Rhodorsil PI 2074 ((p-isopropylphenyl)(p-methylphenyl)-iodonium tetrakis(pentafluorophenyl)borate), 0.5 pphr of the photosensitizer CPTX (1-chloro-4-propoxy-9-H-thioxanthen-9-one), 15 and 3 pphr of the cross-linking additives TMPTG and PPGDG, respectively, and 3 pphr of the adhesion promoter 3-GTS. The composition shown in FIG. 3 had the same components except that the cross-linking additives TMPTG and PPGDG were present in the concentrations 20 and 4 pphr, respectively.

Figure 4:
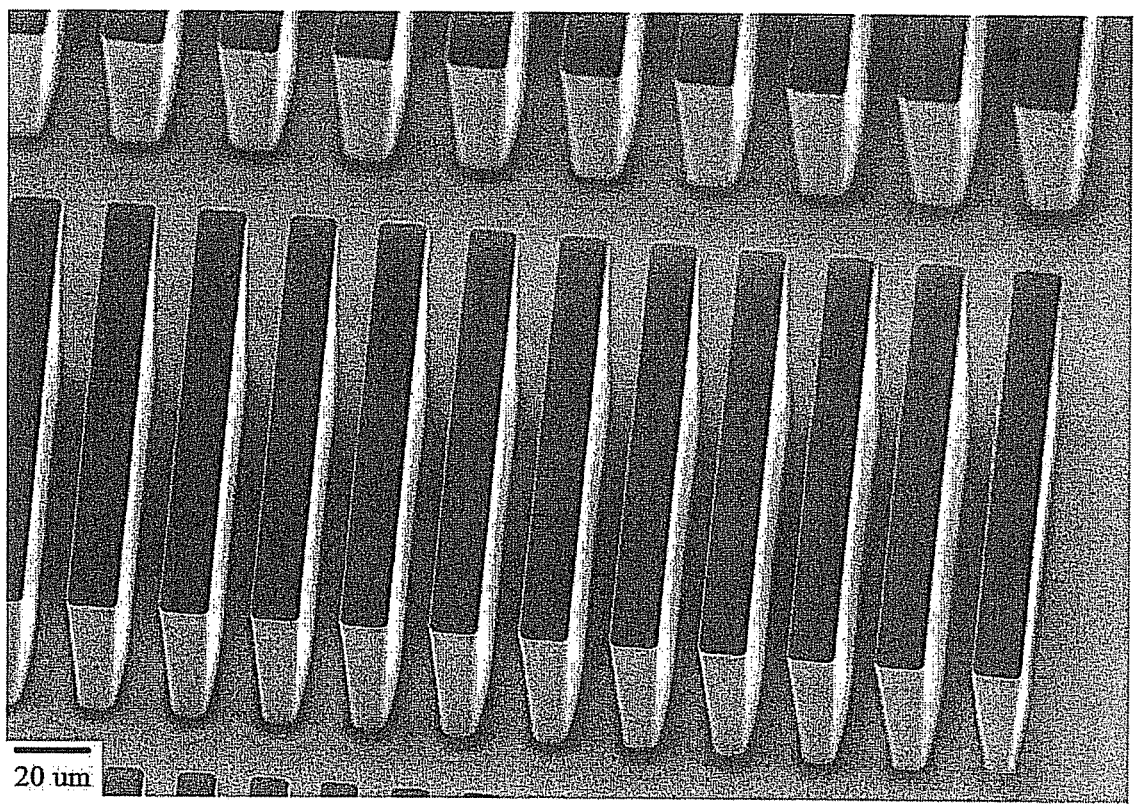
FIG. 4 is a S.E.M. image of a film formed from a polymer composition embodiment in accordance with the present invention that has been photo-patterned to demonstrate polymer structures having an aspect ratio (height:width) of approximately 7:1.
Figure 5:
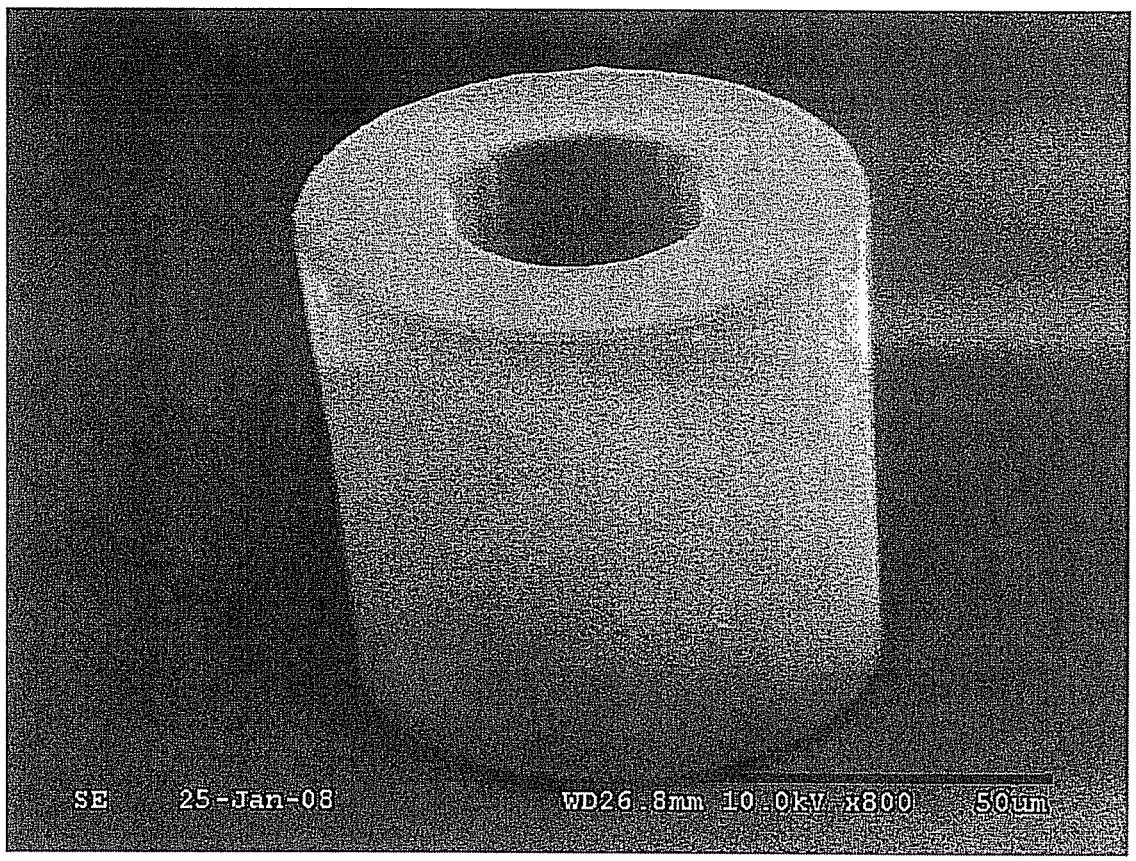
FIG. 5 is a S.E.M. image of a film formed from a polymer composition embodiment in accordance with the present invention that has been photo-patterned to form a hollow-core cylinder having an aspect ratio of approximately 5:1.

Turning to FIGS. 4 and 5, a polymer composition embodiment in accordance with the present invention, (100 pphr 75/25 HFANB/NBCH$_2$CH$_2$CO$_2$H polymer, 1 pphr Rhodorsil, 0.5 pphr CPTX, 3 pphr 3-GTS, 25 pphr TMPTGE and 5 pphr PPGDGE combined as am approximately 25 wt % solution in PGMEA) was spun at 750 RPM, photo patterned with an exposure dose of 500 mJ/cm$^2$. The resulting 70 µm features shown in the scanning electron micrograph (SEM) image of FIG. 4 show a series of lines and spaces that exhibit an aspect ratio of 7:1 (height:width) with smooth, straight side wall profiles. FIG. 6 shows a SEM image of hollow core cylindrical structure having an aspect ratio of 5:1 where the inside diameter of the core corresponds to the width dimension. While the aspect ratio of the hollow structure is lower than the aspect ratio of the solid lines, it is believed that this difference is a function of the development process as such hollow structures required additional develop time as compared to the solid lines and such hollow structures having a desired aspect ratio greater than 5:1 suffered from delamination. It seems reasonable that this problem is due to slower developer transport to the center of the hollow structures than to its exterior and that an alternate developer process can result in enhanced results. Further it should be noted that while the structures in FIG. 4 have a slight non-vertical slope, the hollow pillar in FIG. 5 suggests that the taper is minimal. As one of ordinary skill in the art will realize, sidewall slope may occur in thick, high aspect ratio structures due to the UV absorbance in the upper portions of the film are likely greater than in the lower portions of the film. However, it is believed that if such minimal sidewall slope is not desirable for a specific application, it can be mitigated by using a filter to remove shorter wavelengths that are absorbed in the upper portion of the polymer and by optimizing the exposure dose and baking conditions to obtain uniform cross-link density throughout the film.

As seen in FIGS. 1 through 5, polymer compositions in accordance with the present invention are capable of being imaged with and without the addition of cross-linking and other additives beyond the polymer and a PAG. Further, it will be understood from such aforementioned images, the discussion of exemplary additives and alternate polymer compositions both above and in the Examples provided below, that such polymer compositions can be tailored to meet the requirements of the broad range of applications mentioned above.

The self-imageable films have particularly advantageous imaging properties, particularly when the film has a thickness greater than 30 µm. As film thickness and polymer molecular weight increases, higher exposure energy is typically needed to achieve satisfactory cross-linking of the polymer. The inventive self-imageable films disclosed herein can be imageable with a lower exposure energy than known negative-tone films.

Generally speaking, it has been found that regardless of film thickness (at least in the range of from 2 microns to 70 microns), image-wise exposure using approximately the same amount of energy results in essentially comparable image quality and can be referred an "iso-exposure energy materials" (IEEM). Additionally this amount of energy is less than 1 J/cm².

The self-imageable film compositions disclosed herein have a remarkable ability to be patterned into structures having high a high aspect ratio. "Aspect ratio" refers to the ratio of height to width of a three dimensional feature formed from the self-imageable film. A high aspect ratio allows for the formation of finer detail and greater resolution an imageable film as seen in FIGS. 4 and 5. Without wishing to be bound by theory, it is believed that the ability of the polymer composition embodiments of the present invention is a related to such compositions be an IEEM.

The films disclosed herein also have the ability to form straight sidewalls. Scattering during imaging is believed to be a factor in the undesirable formation of sloped sidewalls. High contrast ratio is believed to contribute to a reduction in sloped sidewalls by suppressing cross-linking promoted by scattered radiation. In an embodiment, the angle of sidewalls of three-dimensional features with the substrate is about 88 degrees or more. In another embodiment, the angle of sidewalls of three-dimensional features with the substrate is about 89 degrees or more.

The films described herein additionally have advantageous glass transition temperature ($T_g$) and curing properties. $T_g$ is a measurement of the temperature at which there is a transition in the elastic properties of the cross-linked films. In an embodiment, $T_g$ of the cross-linked films is from about 275 to about 325° C. In another, embodiment, $T_g$ of the cross-linked films is from about 290 to about 320° C. Curing of the disclosed films can be achieved over the temperature range of about 140 to about 220° C. in an embodiment of the invention. In another embodiment of the invention, curing can be achieved over the temperature range of about 160 to 185° C. The disclosed films have the ability to cure at temperatures less than the $T_g$. Since curing is performed while the films are in a rigid elastic state below the $T_g$, sharper imaging is achievable.

The mechanical properties of the film, including modulus and tensile strength can be modified by selection of cross-linkers included in the film composition. Modulus and tensile strength depend upon the rigidity of the cross-linking network formed between the norbornene-based polymer and cross-linker included in the composition. Multifunctional epoxide cross-linkers (di, tri, and higher) such as TMPTGE, promote a more rigid cross-linking network that results in increased modulus but also decreases elongation to break. A second cross-linker having more flexibility, either due to a more flexible backbone or fewer epoxide functionalities, can be added to arrive at a advantageous modulus, tensile strength, and elongation to break.

EXAMPLES

Some of the following examples provide descriptions of polymerizations of monomers that are useful for forming the polymer composition embodiments of the present invention. It should be noted that while such examples may be used to prepare the polymers employed in the embodiments of the present invention, they are presented only for illustrative purposes and therefore are not limiting. Other examples presented herein relate to characteristics of the polymer and polymer composition embodiments of the present invention. Such characteristics are of interest for enabling polymer design embodiments of the present invention as well as for demonstrating that such polymer and polymer composition embodiments are useful.

Common to all polymerization examples that follow is that the reagents used are essentially moisture and oxygen free (typically <10 ppm oxygen and <5 ppm $H_2O$). That is to say, that both the reagents and solvents are charged into a reaction vessel and then sparged with nitrogen for a period of time believed sufficient to remove essentially all dissolved oxygen, or the reagents and solvents are individually sparged prior to their use and stored under a nitrogen blanket prior to being charged to the reaction vessel. Therefore, it will be understood that while a specific experimental description will not refer to either of the above methods of providing oxygen free reagents and solvents, one or the other was performed. Further, while not specifically mentioned in every example, an appropriate method of stirring or otherwise agitating the contents of a reaction vessel was provided.

As used in the polymerization examples and throughout the specification, ratios of monomer to catalyst, and cocatalyst if present, are molar ratios. Further, a number of acronyms or abbreviations are used in the examples. To aid in the understanding of these examples and to simplify their presentation hereinbelow, the following listing of such acronyms or abbreviations with their full meaning is provided below:

3-GTS: (3-glycidyloxypropyl)trimethoxy silane [CAS: 2530-83-8]

Acid NB: Bicyclo[2.2.1]hept-5-ene-2-carboxylic acid;

AcOH: Acetic acid;

CPTX: 1-chloro-4-propoxy-9-H-thioxanthen-9-one [CAS: 142770-41-1];

THF: Tetrahydrofuran CAS: [109-99-9];

DME: 1,2-Dimethoxyethane CAS: [110-71-4];

DI: Deionized;

DANFABA: N-dimethylanilinium tetrakis-(pentafluorophenyl)borate;

GC: Gas chromatography;

GPC: Gel permeation chromatography;

HFANB: Norbornenyl-2-trifluoromethyl-3,3,3-trifluoropropan-2-ol;

LiFABA: Lithium tetrakis(pentafluorophenyl)borate diethyl etherate;

MeOH: Methanol;

MEK: Methyl ethyl ketone;

$NBCH_2CH_2CO_2H$: Norbornenylpropanoic acid;

NBEMHFP: Norbornene ethoxymethylhexafluoropropanol;

$NBCH_2CH_2CO_2Et$: Norbornenylpropanoic acid ethyl ester;

$NBCH_2CH_2CO_2TMS$: Norbornenylpropanoic acid trimethylsilylester;

NBTODD: Tetraoxadodecanenorbornene;

NBTON: trioxanonanenorbornene;

NiArF: (bis(pentafluorophenyl)nickel toluene) complex;

OXT-121: 1,4-bis[(2-ethyl-3-oxetanylmethoxy)methyl]benzene;

OXT-610: 3-ethyl-(triethoxysilylpropoxy)methyl oxetane [CAS: 3897-65-2]

PAAT: peracetic acid treatment with AcOH/H2O2/H2O at 55%/28%/17% (v/v);

PAG: photo acid generator;

PGME: Propyleneglycol monomethyl ether;
PGMEA: Propyleneglycol methylether acetate;
Polyol R2490: Alkoxylate neopentyl glycol CAS: [52479-58-0];
PPGDG or PPGDGE: Poly(propylene glycol)diglycidyl ether;
Pd 1206: (Acetonitrile)bis(triisopropylphosphine)palladium(acetate)tetrakis(pentafluorophenyl)borate;
Pd 1394: (Acetonitrile)bis(t-butyldicyclohexylphosphine)palladium (acetate)tetrakis(perfluorophenyl)borate;
Rhodorsil PI 2074: (p-isopropylphenyl)(p-methylphenyl)-iodonium tetrakis (pentafluorophenyl)borate;
Silquest A187: Gamma-glycidyloxypropyltrimethoxysilane (product of OSi Specialties);
RT: Room temperature;
TMAH: Tetramethylammonium hydroxide;
TMPTG or TMPTGE: Trimethylolpropane triglycidyl ether CAS: [3454-29-3]
Mw: Average molecular weight;
Mn: Number average molecular weight;
PD or PDI: Polydispersity (Mw/Mn); and
pphr: Part per hundred resin/polymer;
UVR 6105: 3,4-epoxycyclohexyl-3,4-epoxycyclohexane;
UVR 6128: Bis((3,4-epoxycyclohexyl)methyl)adipate;
wt %: weight percent.

Exemplary Nickel Polymerization Process

A polymer encompassing hexafluoroisopropanol, ethyl ester and trioxanonane repeat units derived from HFANB, EPENB and NBTON was prepared as follows: An appropriate sized reaction vessel was dried and purged with N2 to minimize air and water contamination. The vessel was then charged with: toluene (992 g), DME (116 g), HFANB (148 g, 0.540 mol), EPENB (20.7 g, 0.107 mol) and NBTON (61.9 g, 0.274 mol). The reaction medium was purged of oxygen by passing a stream of dry N2 through the solution for 30 minutes while heating to 45° C. In a separate vessel, additional EPENB (14.2 g, 0.073 mol) and NBTON (46.7 g, 0.159 mol), for metering into the reaction vessel, were combined and purged with N2. After the purging was completed, 5.82 g (0.012 mol) of bis(toluene)bis(perfluorophenyl)nickel (NiARF) dissolved in 60.5 ml of toluene was injected into the reaction vessel containing all three monomers. Simultaneously, the metered feed portion of the monomers was added at a rate intended to keep unreacted monomers at a constant level for the duration of the polymerization (3 h). The polymer product was isolated by first adding water to the reaction mixture to ensure termination followed by separation of monomers from polymer (liquid-liquid extraction with polar solvents to enhance phase separation), hydrolysis/acidification using $AcOH/HCO_2H/H_2O_2/H_2O$ to oxidize any remaining nickel followed by extraction of the oxidized nickel into an aqueous phase and the polymer into an organic phase.

Exemplary Palladium Polymerization Process

A polymer encompassing hexafluoroisopropanol and trimethylsilyl protected carboxylic acid units derived from HFANB and NBCH2CH2CO2TMS was prepared as follows: An appropriate sized reaction vessel was dried and purged with N2 to minimize air and water contamination. The vessel was then charged with: toluene (260 g), HFANB (82.4 g, 0.300 mol) and NBCH2CH2CO2TMS (17.85 g, 0.075 mol). The reaction medium was purged of oxygen by passing a stream of dry N2 through the solution for 30 minutes. In an oxygen free environment, 1.04 g (0.746 mmol) of Pd-1394 and 1.80 g (2.25 mmol) of DANFABA was dissolved the monomer solution whereupon the polymerization was initiated by heating the vessel to 90° C. and maintaining that temperature for 16 h. After isolating the polymer having the protected acid group, the protection was removed by hydrolysis using a strong acid and an $HFANB/NBCH_2CO_2H$ was obtained.

The two exemplary polymerization examples provided above are representative of the actual synthesis of such polymers. It should be noted that for Polymerization Examples P1-P6 provided in Table 1, below, the actual processes used to make the specific polymers indicated may differ slightly. However, as such reactions generally are repetitive and well known, the specific details and results of the polymerizations are provided only in tabular form.

TABLE 1

| | Example No. | | | | | |
| --- | --- | --- | --- | --- | --- | --- |
| | P1 | P2 | P3 | P4[2] | P5 | P6 |
| HFANB (g) | 82.4 | 82.2 | 338.4 | — | 257 | 148 |
| exo-NBEMHFP (g) | — | — | — | 23.9 | — | — |
| [3]NBCH$_2$CH$_2$CO$_2$TMS (g) | 17.8 | 17.9 | — | — | — | — |
| [3]NBCH$_2$CH$_2$CO$_2$Et (g) | — | — | 80.2 | 4.9 | 60.7 | 34.9 |
| NBTON (g) | — | — | — | — | — | 108.6 |
| Reaction Solvent[1] | | | | | | |
| wt % | 100 | 90/10 | 90/10 | 90/10 | 84/16 | 90/10 |
| Amount (g) | 260 | 395 | 1675 | | 470 | 1160 |
| Pd 1394 (g) | 1.04 | — | — | 0.26 | — | — |
| DANFABA (g) | 1.80 | — | — | 0.45 | — | — |
| NiArF (g) | — | 0.45 | 8.00 | — | 6.06 | 5.82 |
| Reaction Temp (° C.) | 90 | — | 50 | 70 | 35 | 45 |
| Mw (kDa) | 267 | 252 | 194 | 170 | 47.3 | 81.1 |
| PDI | 2.2 | 2.7 | 2.32 | 1.21 | 2.42 | 1.73 |

[1]The Reaction Solvent for Example 1 is toluene; Examples 5, 18 and 21 is toluene/DME; Example 2 is toluene/di-isopropyl ether; and Example 20 is toluene/MEK. The wt % row indicated the wt % of each solvent of the amount of solvent indicated in the Amount row.
[2]The amount of solvent used was not recorded.
[3]While the polymerizations employed a protected acid monomer, the resulting repeating units are deprotected before the polymer is used to create an imageable composition Common to all formulation examples that follow is that the polymer, the specific additives employed and the casting solvent were charged to a brown bottle and agitated until all components were dissolved. All such formulations were cast onto substrates and otherwise handled under yellow light until after curing. Where a specific viscosity was desired for a formulation, the weight of the solvent to be added was adjusted to greater than or less than a nominal twice the weight of the polymer added.

Each polymer composition was cast, using a programmable spin coater, onto a 4-inch silicon wafer having a thermally grown $SiO_2$ layer thereon. While for the examples that follow the polymer composition was dispensed onto a static 4 inch wafer and then accelerated to a first rotational speed of between 500 rpm and 800 rpm and then held at that speed for 5 seconds after which the wafer was again accelerated to a second rotational speed of between 600 rpm and 2000 rpm where to reach each rotational speed the rate of acceleration was 1000 rpm per second; as one of skill in the art is aware, the specific programs employed to obtain a specific final film thickness will vary as a function of the equipment used, the surface coating of the silicon wafer (if any) and the size of the wafer. Therefore while a casting program for examples 1-5 of a first speed equal to 500 rpm for 5 sec and a second speed equal to 600 rpm for 120 sec generated film thicknesses between 30 and 50 microns, and a casting program for examples 6-8 where said first and second rotational speeds and times were 800 rpm for 10 s, and 1750 rpm for 30 s, respectively, the skilled artisan will understand that these programs were specific to the equipment set and wafer substrates described herein and that where other equipment and wafers are employed, routine experimentation may be needed to achieve a desired coating thickness. Additionally, it should be noted that the polymer compositions of the present invention are generally filtered prior to casting and that choice of such a filter material and its porosity generally tailored to meet the intended use of the composition. For example, examples 6-8 were passed through a net positive charged nylon membrane with pore diameter of 0.2 μm (Posidyne® (Pall Corp.) before being cast onto wafers. Also, while adhesion promoters are optional, where a polymer composition is absent an adhesion promoter additive, before casting a $SiO_2$ coated wafer was subjected to the following plasma pretreatment: 50/50 $Ar/O_2$ plasma at 300 W and 300 mtorr pressure for 30 seconds. For substrates with other coatings, other pretreatments can be employed.

Immediately after casting the polymer composition to the wafers, each wafer was soft baked on a hot plate for 1-2 min to remove the casting solvent and form a film. For Examples 1-5 the hot plate temperature was about 100° C. and at about 120° C. for Examples 6-9. After the soft bake, each wafer was image-wise exposed to actinic radiation. Typically a 12 step density mask was used with input energy density of 1/J cm2 to yield the following positional energy densities in milli-Joules per square centimeter (mJ/cm2): position #1=976; #2=966; #3=944; #4=914; #5=842; #6=710; #7=608; #8=502; #9=404; #10=306; #11=194; and #12=72. Image-wise exposure was followed by development in MICROPOSIT MF CD-26 developer (a 0.26N TMAH solution) for 2-5 minutes, dried and then heated on a hot plate (post exposure bake) for about 2 minutes, cooled and the imaging quality evaluated. Some wafer that exhibited good imaging were subjected to a final thermal cure, generally at a temperature in excess of 150° C.

It should be noted that the coating and imaging process described above is merely illustrative and is not limiting. One of skill in the art should realize that other coating methods, for example spray coating or roller coating, may also be appropriate, as are other bake and cure temperatures and times.

In Table 2, below, each wafer was coated with the composition of $HFANB/NBCH_2CH_2CO_2H$ polymer indicated formulated with the specific PAG and cross-linker species indicated. All formulations included 2.0 g of polymer in 4.0 g of PGME except for 7 and 8 where the carrier solvent was PGMEA.

TABLE 2

| | Example No. | | | | | | | |
|---|---|---|---|---|---|---|---|---|
| | 1 | 2 | 3 | 4 | 5 | [4]6 | [4]7 | [4]8 |
| Composition (molar ratio) | 80/20 | 80/20 | 80/20 | 80/20 | 80/20 | 75/25 | 75/25 | 75/25 |
| Rhodorsil PI 2074 (pphr) | 0.5 | — | — | 1 | 1 | 1 | 1 | 1 |
| TAG 382 (pphr) | — | 0.5 | 0.35 | — | — | — | — | — |
| CPTX (pphr) | 0.5 | — | — | 0.5 | 0.5 | 0.5 | 0.5 | 0.5 |
| TMPTGE (pphr) | 30 | 30 | 30 | 30 | 15 | 25 | 25 | 25 |
| PPGDGE (pphr) | — | — | — | — | — | 5 | 5 | 5 |
| OXT-121 (pphr) | — | — | 5 | — | — | — | — | — |
| 3-GTS (pphr) | — | — | — | 3 | 3 | 3 | 3 | 3 |
| Glycidyl-4-nonyl phenyl ether (pphr) | — | — | — | — | 15 | — | — | — |
| Film thickness (μm) | 30 | 30 | 40 | 37 | 50 | 4 | 4 | 4 |
| Radiation Exp. | 700 mJ/cm$^2$ | 5 step[1] | 3 step[2] | 2 step[3] | 1000 mJ/cm$^2$ | 1 J/cm$^2$ | 3.8 J/cm$^2$ | 3.8 J/cm$^2$ |
| 1:1 Aspect Ratio @ (mJ/cm$^2$) | — | — | — | — | — | 710-966 | 1600-3800 | 1800-3800 |

[1]Samples of the film were individually exposed at 1000, 500, 200, 100 and 50 mJ/cm$^2$.
[2]Samples of the film were individually exposed at 100, 75, and 50 mJ/cm$^2$.
[3]Samples of the film were individually exposed at 300 and 500 mJ/cm$^2$.
[4]Substrate was glass and samples were exposed in a stepwise manner.

For Examples 10-1 through 10-5 summarized in Table 3, below, a composition based on a 75/25 $HFANB/NBCH_2CH_2CO_2H$ polymer having a Mw=150 kDa and a PDI=2.05 was prepared and applied to a substrate to test imageability using the previously mentioned 12 step density mask. For Examples 10-1 to 10-3, a non-epoxide based cross-linker, Powderlink 1174, was included in the composition. In Examples 10-4 and 10-5, no crosslinking additive was included. In Example 10-5, the epoxy containing 3-GTS adhesion promoter was omitted to validate a preliminary observation that imaging was possible without a cross-linker or an epoxy group containing adhesion promoter.

TABLE 3

| | Example No. | | | | |
|---|---|---|---|---|---|
| | 10-1 | 10-2 | 10-3 | 10-4 | 10-5 |
| Rhodorsil (pphr) | — | — | — | 2 | 2 |
| TAG 382 (pphr) | 3 | 3 | 3 | — | — |
| CPTX (pphr) | — | — | — | 1 | 1 |
| 3-GTS AP (pphr) | 5 | 5 | 5 | 3 | — |
| Powderlink 1174 (pphr) | 20 | 20 | 20 | — | — |
| Si-75 (pphr) | — | 5 | — | — | — |
| NXT-*Z100 (pphr) | — | — | 5 | — | — |
| wt % Polymer in PGMEA | 25 | 25 | 25 | 25 | 25 |
| FT (μm): | 10 | 10 | 10 | 11 | 10 |
| Patternability windowb ased on 50 um vias (mJ/cm$^2$) | 194-976 | 306-976 | 306-976 | 765-2440 | 776-4000 |

It can be seen, from the data of Table 3, that Examples 10-4 and 10-5 are both imageable with respect to 50 um vias. With respect to 10-4, it was believed that the 3-GTS adhesion promoter might be the cause of such a result as its structure has an epoxy group that could react with the acid pendent group of the polymer in the presence of the acid generated by the PAG. However, in 10-5 the adhesion promoter was left out of the formulation and imaging was still observed. FIG. 1, discussed before, is a photomicrograph of a wafer prepared as Example 10-5. As previously mentioned, this result, as well as that of Example 10-4, were unexpected as there is no obvious manner for the polymer to form an insoluble portion after image-wise exposure and treatment with an aqueous base developer. However, and without wishing to be bound to any particular theory, it has been suggested that a condensation reaction may occur where a crosslinked matrix of acid anhydrides, or less likely a condensation involving the pendent groups of both the first and second repeating units are involved, produces the observed result. The Examples that follow provide data summarizing the investigations into other formulations of polymer composition embodiments that are useful for proving a negative tone, imageable film that can be developed using an industry standard aqueous base developer such as those based on 0.26N TMAH.

Examples 11-1 through 11-3, summarized in Table 4, below, compare the imaging of polymer compositions where the base polymer includes a third repeating unit. Again the 12 step density mask was used during the exposure. In 11-1 the third repeating unit has an epoxy-containing pendent group and therefore crosslinking additives were absent from the formulation. In Examples 11-2 and 11-3 the third repeating unit is present to demonstrate such a repeating unit can be included without damaging imageability as such a repeating unit can provide useful properties to the final structure.

TABLE 4

| | Example No. | | |
|---|---|---|---|
| | 11-1 | 11-2 | 11-3 |
| HFANB (mol %) | 60 | 45 | 45 |
| EPENB (mol %) | 25 | 15 | 15 |
| MGENB (mol %) | 15 | — | — |
| NBTODD (mol %) | — | 40 | — |
| NBTON (mol %) | — | — | 40 |
| Mw (kDa) | 142 | 80.6 | 81.1 |
| PDI | 2.79 | 1.95 | 1.73 |
| Polymer (pphr) | 100 | 100 | 100 |
| Rhodorsil (pphr) | 2 | 1 | 1 |
| CPTX (pphr) | 1 | 0.5 | 0.5 |
| 3-GTS (pphr) | 3 | 3 | 3 |
| TMPTGE (pphr) | — | 25 | 25 |
| PPGDGE (pphr) | — | 5 | 5 |
| Polymer wt % in PGMEA | 24 | 29 | 29 |
| FT (μm): | 10 | 10 | 11 |
| Exposure Dosage (mJ/cm$^2$): | 1255-2440 | 36-612 | 194-976 |

As seen, each of the formulations proves to be imageable. While the exposure dose required for 11-1 seem high compared with 11-2 and 11-3, these formulations have not been optimized and other formulations may provide different results.

In each of Examples 11-1 through 11-8 the composition was based on a 75/25 HFANB/NBCH$_2$CH$_2$CO$_2$H polymer having a Mw=150 kDa and a PDI=2.05. For Examples 11-1 to 11-3, the DNQ-based PAC additives TS-200, SCL-6 and NT-200 were included in the compositions indicated with DMS-E09 to provide positive tone imaging. For Examples 11-4 through 11-8, the Rhodorsil PAG and CPTX photosensitizer were included to provide Negative Tone imaging. Additionally, varying amounts of the TMPTGE and PPGDGE crosslinking additives were included in these examples to test the effect of reduced concentrations of such additives in view of the results of Examples 10-4 and 10-5.

TABLE 5

| | Example No. | | | | | | | |
|---|---|---|---|---|---|---|---|---|
| | 12-1 | 12-2 | 12-3 | 12-4 | 12-5 | 12-6 | 12-7 | 12-8 |
| TS-200 (pphr) | 16 | — | — | — | — | — | — | — |
| SCL-6 (pphr) | — | 16 | — | — | — | — | — | — |
| NT-200 (pphr) | — | — | 16 | — | — | — | — | — |
| DMS-E09 (pphr) | 30 | 30 | 30 | — | — | — | — | — |
| Si-75 (pphr) | 10 | 10 | 10 | — | — | — | — | — |
| Rhodorsil (pphr) | — | — | — | 1 | 1 | 1 | 1 | 1 |
| CPTX (pphr) | — | — | — | 0.5 | 0.5 | 0.5 | 0.5 | 0.5 |
| 3-GTS AP (pphr) | — | — | — | 3 | 3 | 3 | 3 | 3 |
| TMPTGE (pphr) | — | — | — | 5 | 10 | 15 | 17.5 | 20 |
| PPGDGE (pphr) | — | — | — | 1 | 2 | 3 | 3.5 | 4 |
| wt % Polymer in PGMEA | 33 | 33 | 33 | 40 | 38 | 37 | 37 | 36 |

TABLE 5-continued

|  | \multicolumn{8}{c}{Example No.} |
| --- | --- | --- | --- | --- | --- | --- | --- | --- |
|  | 12-1 | 12-2 | 12-3 | 12-4 | 12-5 | 12-6 | 12-7 | 12-8 |
| FT (μm): | 43 | 44 | 54 | 49 | 44 | 43 | 45 | 44 |
| [1]Description of 50 um vias (*@ 306 mJ/cm$^2$) | A | Bs | A | C* | D* | D* | E* | F* |

[1]The imaging codes are as follows: A = Unpatterned residue; B = Significant film loss; C = Poor resolution; D = Cracked corners; E = Minor cracks; and F = Sharp, clean vias.

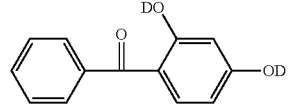

SCL-6

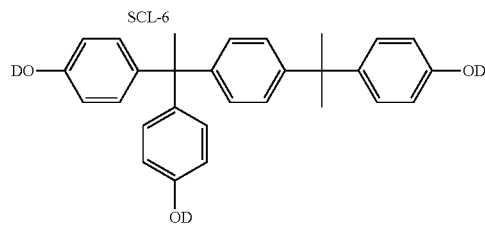

TS-200

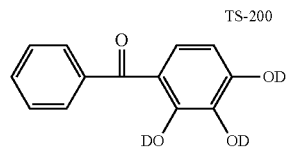

NT-200 where D is:

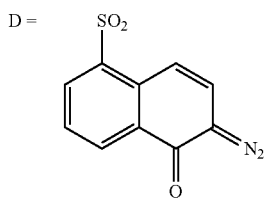

As seen for Examples 12-1 through 12-3, the positive tone formulations, essentially equivalent to what is found in the '594 patent, do not provide images when applied as thick films >40 microns. On the other hand, the polymer compositions of 12-7 and 12-8 indicate close to acceptable and excellent images, respectively and thus demonstrate the advantage of such compositions that are considered as embodiments in accordance with the present invention.

Examples 13-1 through 13-5 compare the imageability of several polymer compositions containing the same base polymer 80/20 HFANB/NB(CH$_2$)$_2$COOH but with differing weight average molecular weights. Each of the compositions tested had the same relative composition of polymer and additives (on a pphr basis). All were coated to the film thickness indicated in Table 6, exposed using a 12 step density mask and Examples 13-2, 13-3 and 13-6 subsequently evaluated for final patterned film reliability using a JEDEC level 3 time/temperature/relative humidity soak (30° C., 60% RH for 192 hours) followed by three cycles of a 260° C. reflow test. All three samples tested passed.

TABLE 6

|  | \multicolumn{5}{c}{Examples} |
| --- | --- | --- | --- | --- | --- |
|  | 13-1 | 13-2 | 13-3 | 13-4 | 13-5 |
| Polymer Mw | 120K | 141K | 176K | 211K | 252K |
| PDI | 1.87 | 1.73 | 1.99 | 2.16 | 2.66 |
|  | \multicolumn{5}{c}{Formulation Recipe} |
| Polymer | 5.0 g | 66.67 g | 34 g | 5.0 g | 30 g |
| TMPTGE (25 pphr) | 1.25 g | 16.67 g | 8.5 g | 1.25 g | 7.5 g |
| PPGDGE (5 pphr) | 0.25 g | 3.33 g | 1.7 g | 0.25 g | 1.5 g |
| Silquest A-187 (3 pphr) | 0.15 g | 2.0 g | 1.02 g | 0.15 g | 0.9 g |
| Rhodorsil PI 2074 (1 pphr) | 0.05 g | 0.67 g | 0.34 g | 0.05 g | 0.3 g |

TABLE 6-continued

| | Examples | | | | |
|---|---|---|---|---|---|
| | 13-1 | 13-2 | 13-3 | 13-4 | 13-5 |
| CPTX (0.5 pphr) | 0.025 g | 0.33 g | 0.17 g | 0.025 g | 0.15 g |
| PGME (2x weight of polymer) | 10 g | 133.32 g | 68 g | 10 g | 60 g |
| | I-line Imageability | | | | |
| Film thickness (μm) | 40 | 40 | 54 | 47 | 47 |
| Develop time (minute) | 3.5 | 3.5 | 5.5 | 5.5 | 5.5 |
| Patternability window (based 50 micron via open)(mJ/cm$^2$) | 306-1000 | 502-1000 | 710-1000 | 710-1000 | 710-1000 |

As shown, the energy required to achieve 50 μm patternability increased with Mw from Example 13-1 to 13-3 and then appeared to level out despite a continued increase in Mw and an increase in the measured film thickness.

Examples 14-1 and 14-2 were used to determine imageability of polymer compositions that employ either cycloaliphatic epoxide cross-linker additives (14-1) or silicon epoxide cross-linker additives (14-2). For each example a film, approximately 40 μm thick was cast onto a silicon substrate and exposed using the 12 step density mask. For each composition the relative amounts of the various components were kept the same on a pphr basis other than for Example 14-1 two cross-linking additives were provided to total 30 pphr while for 14-2, 30 pphr of a single cross-linking additive was used.

TABLE 7

| | Example 14-1 | Example 14-2 |
|---|---|---|
| 80/20 HFANB/NB(CH$_2$)$_2$COOH | 10 g | 6.5 g |
| UVR6105 (15 pphr) | 1.5 g | |
| UVR6128 (15 pphr) | 1.5 g | |
| Silicon Epoxy DMS-E09 (30 pphr) | | 1.95 g |
| Silquest A-187 (3 pphr) | 0.3 g | 0.19 |
| Rhodorsil 2074P (1 pphr) | 0.1 g | 0.065 g |
| CPTX (0.5 pphr) | 0.05 g | 0.033 g |
| PGME (2× weight of polymer) | 20 g | 13 g |
| Spin speed (ramp) | 500 rpm/5 s/500 rpm/120 s (1000 r/s) | 500 rpm/5 s/600 rpm/120 s (1000 r/s) |
| Film thickness (micron) | ~40 | ~40 |
| Develop time (minute) | 3.0 | 3.5 |
| Patternability window (based 50 micron via open) (mJ/cm$^2$) | 404-1000 | 502-1000 |

Both polymer compositions showed broad imaging windows and resolution of both 100 μm lines and 50 μm vias.

By now it should be realized that a useful, negative-tone, aqueous developable polymer composition has been disclosed herein. Further is should be realized that embodiments of such a composition that are in accordance with the present invention can be prepared by combining a polymer encompassing at least the first and second types of repeating units described above with an appropriate casting solvent(s) and either one or more of the broad range additives disclosed through the structures and listings of exemplary materials provided above or with only a PAG (where an appropriate exposure wavelength is used).

It should further be realized that the listings of the groups of materials provided herein (cross-linkers, PAGs, adhesion promoters and the like) are merely examples of materials useful for polymer compositions in accordance with the present invention and that other materials, either currently known or not yet known, that provide the same function are within the scope of the present invention.

What is claimed is:

1. A polymer composition for forming a negative tone, self-imageable film comprising:

a polymer comprising a first repeating unit and a second repeating unit represented by formula Ia:

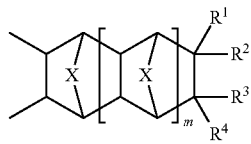

Ia where for said first repeating unit one of $R^1$, $R^2$, $R^3$ and $R^4$ is —$R^5$COOH and the others are hydrogen, and where for said second repeating unit one of $R^1$, $R^2$, $R^3$ and $R^4$ is a pendent hydrocarbyl group represented by one of formulae B, C or D:

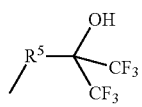

B

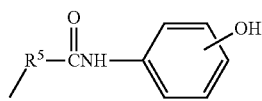

C

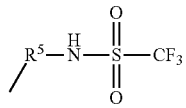

D where $R^5$ for said first repeating unit is a $C_1$ to $C_6$ alkyl moiety and the others of $R^1$, $R^2$, $R^3$ and $R^4$ are hydrogen, and $R^5$ for said second repeating unit is —CH$_2$CH$_2$OCH$_2$—;

a photoacid generator; and a casting solvent selected from one or more of propyleneglycol monomethylether, propyleneglycol monomethylether acetate, gamma-butyrolactone, and cyclohexanone.

2. The polymer composition of claim 1, where for said second repeating unit the pendent hydrocarbyl group is represented by formula B.

3. The polymer composition of claim 1, further comprising a photosensitizer.

4. The polymer composition of claim 3, where the photoacid generator is (p-isopropylphenyl)(p-methylphenyl)-iodonium tetrakis (pentafluorophenyl)borate or (2-(4-methoxynaphthalene-1-yl)-2-oxoethyl)dimethylsulfonium tetrakis (pentafluorophenyl)borate and the photosensitizer is 1-chloro-4-propoxy-9-H-thioxanthen-9-one.

5. The polymer composition of claim 1 where for said first repeating unit $R^5$ is —$CH_2CH_2$—, the second repeating unit is represented by formula B, the photoacid generator is (p-isopropylphenyl)(p-methylphenyl)-iodonium tetrakis (pentafluorophenyl) borate and further comprising a photosensitizer consisting of 1-chloro-4-propoxy-9-H-thioxanthen-9-one.

6. The polymer composition of claim 1 or 5, further comprising an adhesion promoter selected from (3-glycidyloxypropyl)trimethoxy silane or 3-ethyl-(triethoxysilylpropoxy) methyl oxetane.

7. The polymer composition of claim 1, further comprising one or more cross-linking moieties selected from poly(propylene glycol)diglycidyl ether, trimethylolpropane triglycidyl ether, 3,4-epoxycyclohexyl-3,4-epoxycyclohexane, 1,4-bis[(2-ethyl-3-oxetanylmethoxy)methyl]benzene or tetrakis(methoxymethyl)glycoluril.

8. The polymer composition of claim 7, further comprising a photosensitizer and an adhesion promoter, where the photosensitizer is 1-chloro-4-propoxy-9-H-thioxanthen-9-one and the adhesion promoter is (3-glycidyloxypropyl)trimethoxy silane.

9. A polymer composition for forming a negative tone, self-imageable film comprising:

a polymer comprising a first repeating unit and a second repeating unit derived from a norbornene-type monomer represented by formula I:

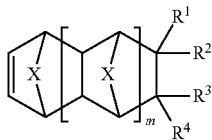

I where for said first repeating unit one of $R^1$, $R^2$, $R^3$ and $R^4$ is —$R^5COOH$ and the others are hydrogen, and where for said second repeating unit one of $R^1$, $R^2$, $R^3$ and $R^4$ is a pendent hydrocarbyl group represented by formula B:

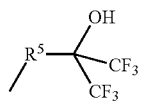

B where $R^5$ is a $C_1$ to $C_6$ alkyl moiety or —$CH_2CH_2OCH_2$— and the others of $R^1$, $R^2$, $R^3$ and $R^4$ are hydrogen;

a photoacid generator;
a photosensitizer;
an adhesion promoter;
one or more cross-linking moieties selected from polypropylene glycol)diglycidyl ether, trimethylolpropane triglycidyl ether, 3,4-epoxycyclohexyl-3,4-epoxycyclohexane, tetrakis(methoxymethyl)glycoluril or 1,4-bis[(2-ethyl-3-oxetanylmethoxy)methyl]benzene; and
a casting solvent selected from one or more of propyleneglycol monomethylether, propyleneglycol monomethylether acetate, gamma-butyrolactone, and cyclohexanone,
wherein the photoacid generator is selected from (p-isopropylphenyl)(p-methylphenyl)-iodonium tetrakis (pentafluorophenyl) borate or (2-(4-methoxynaphthalene-1-yl)-2-oxoethyl)dimethylsulfonium tetrakis (pentafluorophenyl) borate, and the photosensitizer consists of 1-chloro-4-propoxy-9-H-thioxanthen-9-one.

10. The polymer composition of claim 9 where for said first repeating unit $R^5$ is —$CH_2CH_2$—, for the second repeating unit $R^5$ is —$CH_2$—, the photoacid generator is (p-isopropylphenyl)(p-methylphenyl)-iodonium tetrakis (pentafluorophenyl) borate and the adhesion promoter is selected from (3-glycidyloxypropyl)trimethoxy silane or 3-ethyl-(triethoxysilylpropoxy)methyl oxetane.

11. The polymer composition of claim 1 or 9 further comprising a third repeating unit represented by formula Ia:

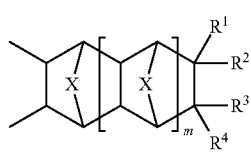

Ia where one of $R^1$, $R^2$, $R^3$ and $R^4$ is selected from epoxyhexylnorbornene, epoxycyclohexanenorbornene, hexylnorbornene, trioxanonanenorbornene, tetraoxadodecanenorbornene, methyl glycidylethernorbornene, [(3-ethyl-3-oxetanyl)methoxy]dimethylnorbornenylethylsilane and 5-norbornene-2-yl(methylene)-4,4'-bis-(2,6-di-tert-butylphenol).

* * * * *

UNITED STATES PATENT AND TRADEMARK OFFICE
CERTIFICATE OF CORRECTION

| | | |
|---|---|---|
| PATENT NO. | : 8,580,477 B2 | Page 1 of 1 |
| APPLICATION NO. | : 12/563627 | |
| DATED | : November 12, 2013 | |
| INVENTOR(S) | : Brian Knapp et al. | |

It is certified that error appears in the above-identified patent and that said Letters Patent is hereby corrected as shown below:

In the Claims:

Column 31, Line 8, Claim 4, delete "(pentafluorophenyl)borate" and insert -- (pentafluorophenyl) borate --

Column 32, Line 48, Claim 11, delete "methyl glycidylethernorbornene" and insert -- methylglycidylethernorbornene --

Signed and Sealed this
Fourth Day of March, 2014

Michelle K. Lee
*Deputy Director of the United States Patent and Trademark Office*